(12) United States Patent
Lai et al.

(10) Patent No.: US 9,704,892 B2
(45) Date of Patent: Jul. 11, 2017

(54) DISPLAY PANEL

(71) Applicant: Innolux Corporation, Chu-Nan, Miao-Li County (TW)

(72) Inventors: Hsiao-Ping Lai, Chu-Nan (TW); Chao-Liang Lu, Chu-Nan (TW); Tzu-Min Yan, Chu-Nan (TW); Tsau-Hua Hsieh, Chu-Nan (TW)

(73) Assignee: INNOLUX CORPORATION, Chu-Nan, Miao-Li County (TW)

( * ) Notice: Subject to any disclaimer, the term of this patent is extended or adjusted under 35 U.S.C. 154(b) by 0 days.

(21) Appl. No.: 15/018,861

(22) Filed: Feb. 8, 2016

(65) Prior Publication Data

US 2016/0233236 A1    Aug. 11, 2016

(30) Foreign Application Priority Data

Feb. 9, 2015   (TW) .............................. 104104282 A

(51) Int. Cl.
  *H01L 29/49*   (2006.01)
  *H01L 27/12*   (2006.01)
  *H01L 29/786*  (2006.01)
  *G02F 1/1362*  (2006.01)

(52) U.S. Cl.
  CPC .......... *H01L 27/124* (2013.01); *G02F 1/1362* (2013.01); *H01L 29/78633* (2013.01); *G02F 2001/136218* (2013.01)

(58) Field of Classification Search
  CPC ............. H01L 27/124; G02F 1/133502; G02F 1/135512; G02F 1/136227
  See application file for complete search history.

(56) References Cited

U.S. PATENT DOCUMENTS

2005/0174520 A1*  8/2005  Tomihari .......... G02F 1/136209
                                                        349/139
2015/0077393 A1*  3/2015  Kawachi ................ G06F 3/044
                                                        345/174
2015/0192833 A1*  7/2015  Ono .................. G02F 1/136213
                                                        349/41

FOREIGN PATENT DOCUMENTS

JP              5604481 B2     10/2014

\* cited by examiner

*Primary Examiner* — Michael Shingleton
(74) *Attorney, Agent, or Firm* — Rabin & Berdo, P.C.

(57) ABSTRACT

A display panel including a first substrate, a second substrate and a display medium is provided. The first substrate includes a base substrate, a gate, an active layer, a source, a drain, and a shielding structure. The gate is disposed on the base substrate. The active layer is electrically insulated from and disposed correspondingly to the gate. The source and the drain are electrically connected to the active layer. The shielding structure is disposed on the active layer and covers at least part of the active layer. The shielding structure includes a metal layer and an anti-reflection structure. The display medium is disposed between the first substrate and the second substrate.

12 Claims, 11 Drawing Sheets

DISPLAY PANEL

This application claims the benefit of Taiwan application Serial No. 104104282, filed Feb. 9, 2015, the subject matter of which is incorporated herein by reference.

BACKGROUND OF THE INVENTION

Field of the Invention

The invention relates in general to a display panel, and more particularly to a display panel with high aperture ratio.

Description of the Related Art

Along with the rapid development in display technology, high resolution display capable of processing digital signals and showing more delicate frames has gradually become a mainstream product in the market for whatever panel sizes. That is, the same size requires more pixels.

However, high resolution is usually achieved at the cost of aperture ratio of the pixel. Here, the aperture ratio refers to the ratio of light transmissive area to the entire area of the pixel. The light transmissive area refers to the area of the pixel exclusive of wires and transistors. The higher the aperture ratio, the larger the light transmissive area. In the prior art, during the assembly process of a thin film transistor (TFT) substrate and a color filter (CF) substrate, the two substrates can be aligned according to alignment marks. When the elements on the substrates may be changed, rotated or deformed during the assembly process, the assembly precision will be hard to control and the aperture ratio of the product will be affected.

Therefore, how to maintain high assembly precision of the display panel and high aperture ratio of the pixel so that power consumption of the display can be reduced has become a prominent task for the industries.

SUMMARY

The invention is directed to a display panel. According to some embodiments, through the design of disposing a metal layer and an anti-reflection structure on a substrate, the area of the light-shielding matrix can be reduced and the aperture ratio of the display panel can be effectively increased.

According to one embodiment of the present invention, a display panel including a first substrate, a second substrate and a display medium is provided. The first substrate includes a base substrate, a gate, an active layer, a source, a drain, and a shielding structure. The gate is disposed on the base substrate. The active layer is electrically insulated from and corresponding to the gate. The source and the drain are electrically connected to the active layer. The shielding structure is disposed on the active layer and covers at least part of the active layer. The shielding structure includes a metal layer and an anti-reflection structure. The display medium is disposed between the first substrate and the second substrate.

The above and other aspects of the invention will become better understood with regard to the following detailed description of the non-limiting embodiment(s). The following description is made with reference to the accompanying drawings.

DETAILED DESCRIPTION

Descriptions of the embodiments of the present invention are disclosed below with reference to accompanying drawings. Designations common to the accompanying drawings are used to indicate identical or similar elements. It should be noted that the accompanying drawings are simplified such that the embodiments can be more clearly described, and dimension scales used in the accompanying drawings are not based on actual proportion of the product. Therefore, the specification and accompanying drawings are for explanatory and exemplary purposes only, not for limiting the scope of protection of the present disclosure.

In an embodiment of the present invention, the display panel may include a first substrate, a second substrate and a display medium. The second substrate and the first substrate are disposed oppositely. The display medium is disposed between the first substrate and the second substrate. For example, the first substrate can be realized by a thin film transistor substrate, the second substrate can be realized by a color filter substrate, and the display medium can be realized by a liquid crystal layer, but the present invention is not limited thereto.

In an embodiment of the present invention, the first substrate may include a base substrate, a gate, an active layer, a source, a drain, and a shielding structure. The gate is disposed on the base substrate. The active layer is electrically insulated from and corresponds to the gate. The source and the drain are electrically connected to the active layer. The shielding structure is disposed on the active layer and covers at least part of the active layer. The shielding structure includes a metal layer and an anti-reflection structure. The anti-reflection structure can contact the metal layer.

Different implementations of the display panel of the present invention are disclosed below in the first to the fifth embodiment.

First Embodiment

Figure 1A:
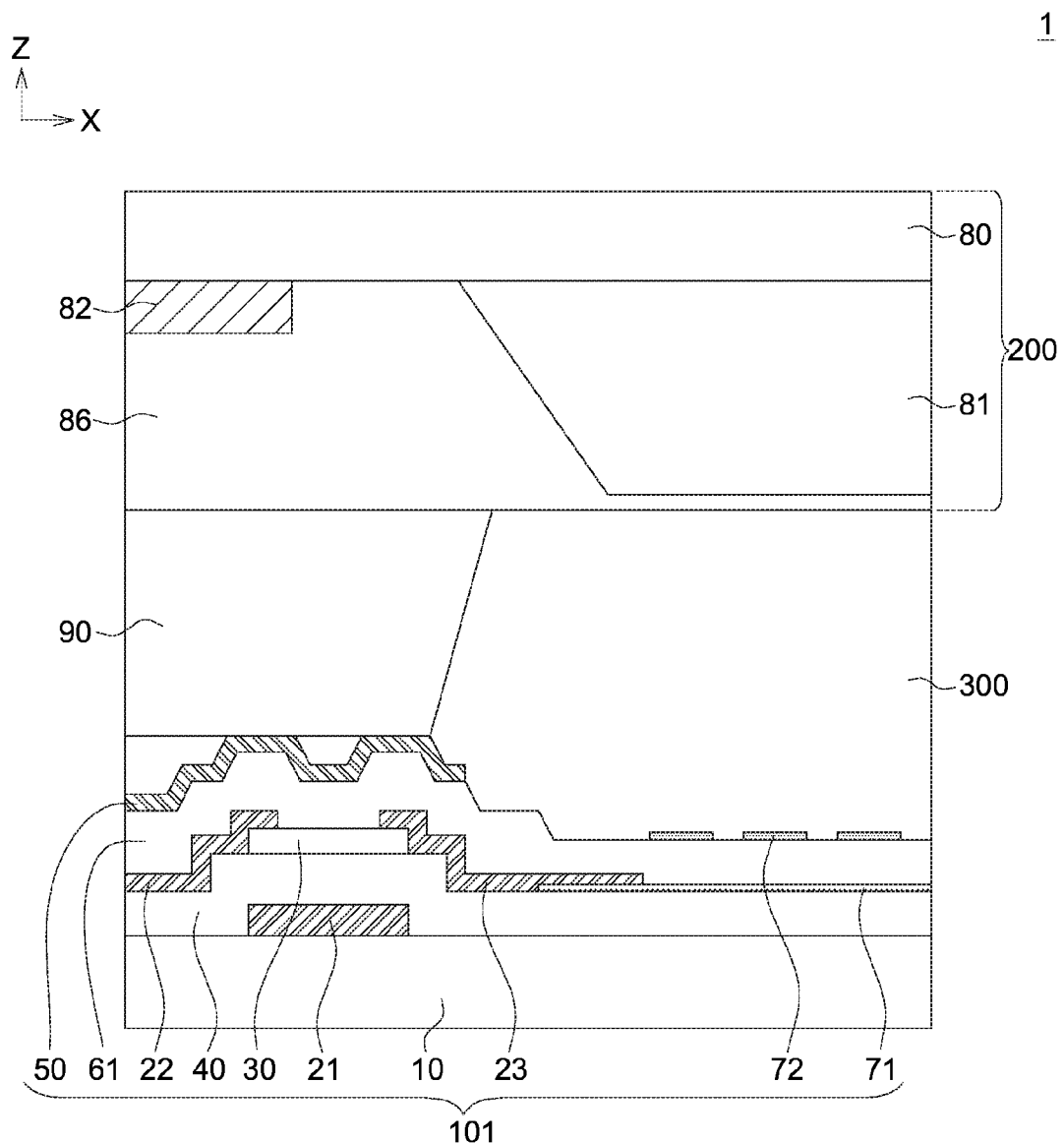
FIG. 1A is a partial cross-sectional view of a display panel according to the first embodiment of the present invention.
Figure 1B:
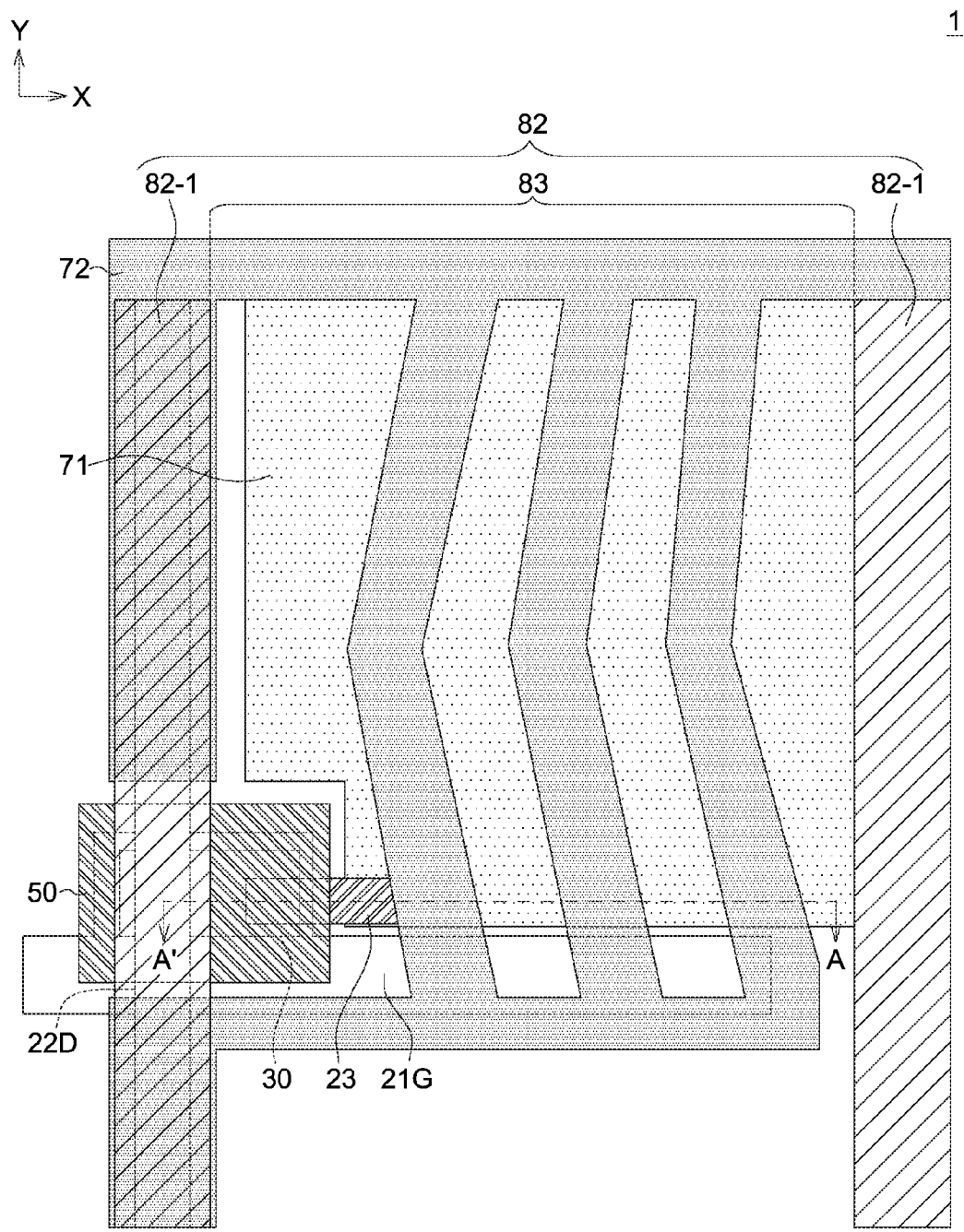
FIG. 1B is a partial top view of the display panel according to the first embodiment of the present invention.

FIG. 1A is a partial cross-sectional view of a display panel 1 according to the first embodiment of the present invention. FIG. 1B is a partial top view of the display panel 1 according to the first embodiment of the present invention. Here, FIG. 1A is a cross-sectional view of the display panel 1 viewed along a cross-sectional line A-A' of FIG. 1B.

As indicated in FIGS. 1A and 1B, the display panel 1 may include a first substrate 101, a second substrate 200 and a display medium 300. The second substrate 200 and the first substrate 101 are disposed oppositely. The display medium 300 is disposed between the first substrate 101 and the second substrate 200. The display medium 300 can be realized by such as a liquid crystal layer or an organic light emitting layer. Besides, the display panel 1 may also include a spacer 90 disposed between the first substrate 101 and the second substrate 200.

In the first embodiment of the present invention, the first substrate 101 includes a base substrate 10, a gate 21, an active layer 30, a source 22 and a drain 23, a gate insulating layer 40 and a shielding structure 50. The gate 21, the active layer 30, the source 22, the drain 23 and the gate insulating layer 40 form a transistor. The gate 21 is disposed on the base substrate 10. The active layer 30 and the gate 21 are disposed oppositely. The source 22 and the drain 23 are electrically connected to the active layer 30. The active layer 30 is electrically insulated from and corresponds to the gate 21. For example, the gate insulating layer 40 is disposed between the gate 21 and the active layer 30.

In the present embodiment, the base substrate 10 can be realized by a glass substrate or a flexible substrate (formed of plastics for example). The active layer 30 can be realized by an amorphous silicon (a-Si) layer, a polysilicon layer or a metal oxide layer. The metal oxide layer, used in the active layer, can be realized by an indium gallium zinc oxide (IGZO) layer. Moreover, the shielding structure 50 can be realized by a bi-layer or multi-layer structure.

Figure 2A:
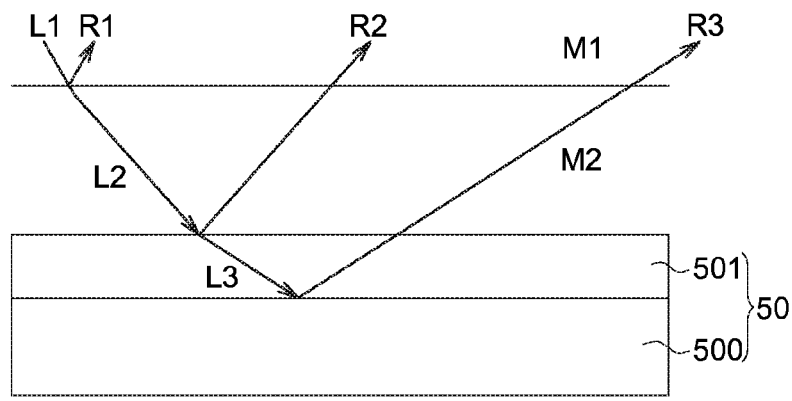
FIGS. 2A~2C are schematic diagrams of a shielding layer according to different embodiments of the present invention.
Figure 2B:
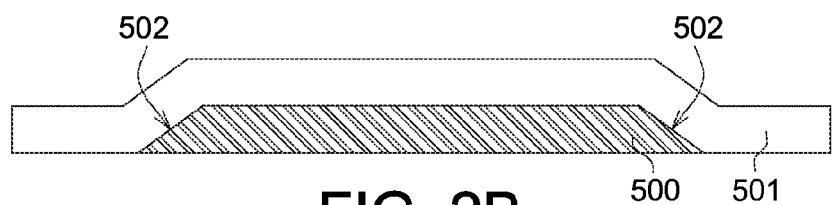
Figure 2C:
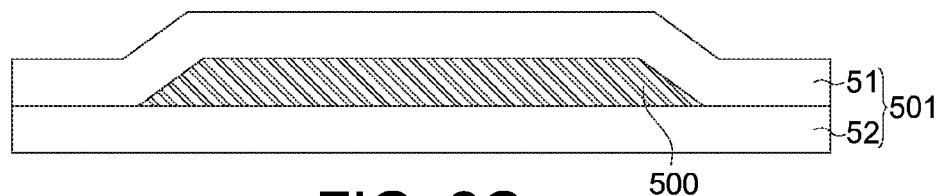

FIGS. 2A~2C are schematic diagrams of a shielding layer 50 according to different embodiments of the present invention. The shielding structure 50 may include a metal layer 500 and an anti-reflection structure 501. The anti-reflection structure 501 may be disposed above the metal layer 500. According to some embodiments, the anti-reflection structure 501 can be directly in contact with the metal layer 500. Or, alternatively, the anti-reflection structure 501 is not in contact with the metal layer 500 in other embodiments. Destructive interference generated by the reflected light of the anti-reflection structure 501 and the reflected light of the metal layer 500 can reduce the overall reflectance of the shielding layer 50.

For example, as indicated in FIG. 2A, when a light L1 enters a medium M2 via a medium M1, the light will be refracted as a light L2 and at the same time generate a reflected light R1 on the interface between the mediums M1 and M2. When the light L2 enters the anti-reflection structure 501 via the medium M2, the light L2 will be refracted as a light L3 and at the same time generate a reflected light R2 on the interface between the medium M2 and the anti-reflection structure 501. When the light L3 enters the metal layer 500, the light L3 will be reflected as a reflected light R3. Here, the medium M1 is such as air, and the medium M2 is such as glass. Since the anti-reflection structure 501 and the metal layer 500 have different refractive indexes, a path difference, which causes non-constructive interference (or destructive interference), will be formed between the reflected light R2 generated on the interface of the anti-reflection structure 501 and the reflected light R3 generated on the interface of the metal layer 500. The refractive index of the anti-reflection structure 501 can be larger or smaller than that of the metal layer 500.

In an embodiment of the present invention, the metal layer 500 is formed of a material selected from the group composed of aluminum (Al), molybdenum (Mo), chromium (Cr), Nickel (Ni), copper (Cu), iron (Fe), neodymium (Nd), an alloy thereof, and a mixture of the said metals and alloy. That is, the metal layer 500 can be realized by the said metals, an alloy thereof, or a mixture of the said metals and alloy. For example, when the metal layer 500 is formed of an alloy, the alloy can be realized by aluminum alloy, nickel alloy or copper alloy.

The anti-reflection structure 501 is formed of a material selected from the group composed of a metal oxide, a metal nitride, a metal alloy oxide, a metal alloy nitride, and a mixture thereof. For example, the anti-reflection structure may include indium zinc oxide (ITO), and indium zinc oxide (IZO).

Additionally, the metal element contained in the anti-reflection structure 501 can be the same as the metal element contained in the metal layer 500. For example, the anti-reflection structure 501 can be formed of an oxide or a nitride of the metal material of the metal layer 500. Moreover, the metal layer 500 can further be oxidized or nitrified to form an anti-reflection structure. Specifically, when the metal layer 500 is formed of aluminum, the anti-reflection structure 501 can be formed of an aluminum oxide or an aluminum nitride. Also, when the metal layer 500 is formed of an alloy, the anti-reflection structure 501 can be formed of an oxide or a nitride of the alloy. Specifically, when the metal layer 500 is formed of an aluminum-nickel alloy, the anti-reflection structure 501 can be formed of an oxide or a nitride of the aluminum-nickel alloy. When the metal layer 500 is formed of an aluminum-copper alloy, the anti-reflection structure 501 can be formed of an oxide or a nitride of the aluminum-copper alloy.

As indicated in FIG. 2B, the anti-reflection structure 501 is disposed above the metal layer 500, and can completely cover the metal layer 500 and a sidewall 502 of the metal layer 500. Such structure effectively avoids the reflectance of the tapered sidewall 502 of the metal layer 500 from being too high.

Additionally, the anti-reflection structure 501 can also be realized by a bi-layer or multi-layer structure. For example, the anti-reflection structure 501 may include a first anti-reflection layer 51 and a second anti-reflection layer 52 respectively disposed on two sides of the metal layer 500 as indicated in FIG. 2C. In the present embodiment, the first anti-reflection layer 51 is disposed on an upper side of the metal layer 500 to reduce the reflection of ambient light coming from the outside of the display panel 1, and the second anti-reflection layer 52 is disposed on a lower side of the metal layer 500 to reduce the reflection of the light emitted from a backlight module (not illustrated). Here, the upper side refers to the side close to a light-exiting side of the second substrate 200, and the lower side refers to the other side away from the light-exiting side.

However, the present invention does not restrict the number of layers of the anti-reflection structure 501. That is, the anti-reflection structure 501 may include more anti-reflection layers. The anti-reflection structure 501 can be disposed on the upper side and/or the lower side of the metal layer 500. Moreover, there is no restriction regarding the number of layers of the anti-reflection structure 501. When the anti-reflection structure 501 includes multiple anti-reflection layers, for example, the multi-layer anti-reflection structure can be disposed on the upper side of the metal layer 500, and there is no restriction regarding the refractive index n of each anti-reflection layer. For example, the refractive indexes of the multiple anti-reflection layers can gradually increase or decrease towards the light-exiting side. Or, the refractive indexes of the multiple anti-reflection layers can be staggered as large/small/large/small.

In the first embodiment of the present invention, the first substrate 101 may further include a first protection layer 61, a first electrode 71 and a second electrode 72. The first protection layer 61 is disposed between the active layer 30 and the shielding structure 50. The first electrode 71 is in contact with the drain 23. The second electrode 72 is disposed on the first protection layer 61. Additionally, the shielding structure 50 may have the same structure as that illustrated in FIG. 2C. That is, the anti-reflection structure 501 (the second anti-reflection layer 52) of the shielding structure 50 may be directly in contact with the first protection layer 61. The metal layer 500 and the anti-reflection structure 501 can effectively shield the active layer 30.

The first electrode 71 and the second electrode 72 can be realized by transparent conductive layers formed of such as indium tin oxide (ITO) or indium zinc oxide (IZO). In the present embodiment, the first electrode 71 can be realized by a pixel electrode layer, and the second electrode 72 can be realized by a common electrode layer. As indicated in FIG. 1B, the second electrode 72 can be grid-like.

FIG. 1B shows a gate line 21G and a data line 22D. The gate 21 of FIG. 1A is connected to the gate line 21G of FIG. 1B. The source 22 of FIG. 1A is connected to the data line 22D of FIG. 1B.

In an embodiment of the present invention, the second substrate 200 can be realized by a color filter substrate including a base substrate 80, a color filter 81, a light-shielding matrix 82 and a planarization layer 86. The planarization layer 86 can be realized by an organic transparent planarization layer. The light-shielding matrix 82 includes a plurality of first light-shielding portions 82-1 and a plurality of first opening portions 83. The first light-shielding portions 82-1 are disposed at intervals and extend along a first direction (the Y direction). In this embodiment, the Y direction can be a direction parallel to the data lines 22D. The first opening portions 83 are exposed from the first light-shielding portions 82-1. As indicated in FIG. 1B, a first opening portion 83 is disposed between two first light-shielding portions 82-1 of the second substrate 200.

Since the shielding structure 50 (including a metal layer 500 and an anti-reflection structure 501) already shields the active layer 30, the light-shielding matrix 82 can be used to avoid light from mixing between adjacent pixels. Therefore, at least part of the vertical projection of the active layer 30 on the second substrate 200 falls inside the first opening portion 83. It can be seen from relative relationship between the active layer 30 and the light-shielding matrix 82 as illustrated in a planar diagram that the first opening portion 83 of the light-shielding matrix 82 exposes at least part of the active layer 30. That is, the light-shielding matrix 82 of the present embodiment does not need to shield the active layer 30 in a second direction (the X direction). In some embodiments, the light-shielding matrix 82 can shield part, not all, of the active layer in the second direction. Thus, in some embodiments, the light-shielding matrix 82 can be effectively reduced, and the aperture ratio of the display panel 1 can be increased. The second direction and the first direction are not the same. In the embodiment, X direction can be a direction parallel to the gate lines 21G. In the diagram, the second direction refers to the X direction. In the present embodiment, the second direction is orthogonal to the first direction.

Second Embodiment

Figure 3A:
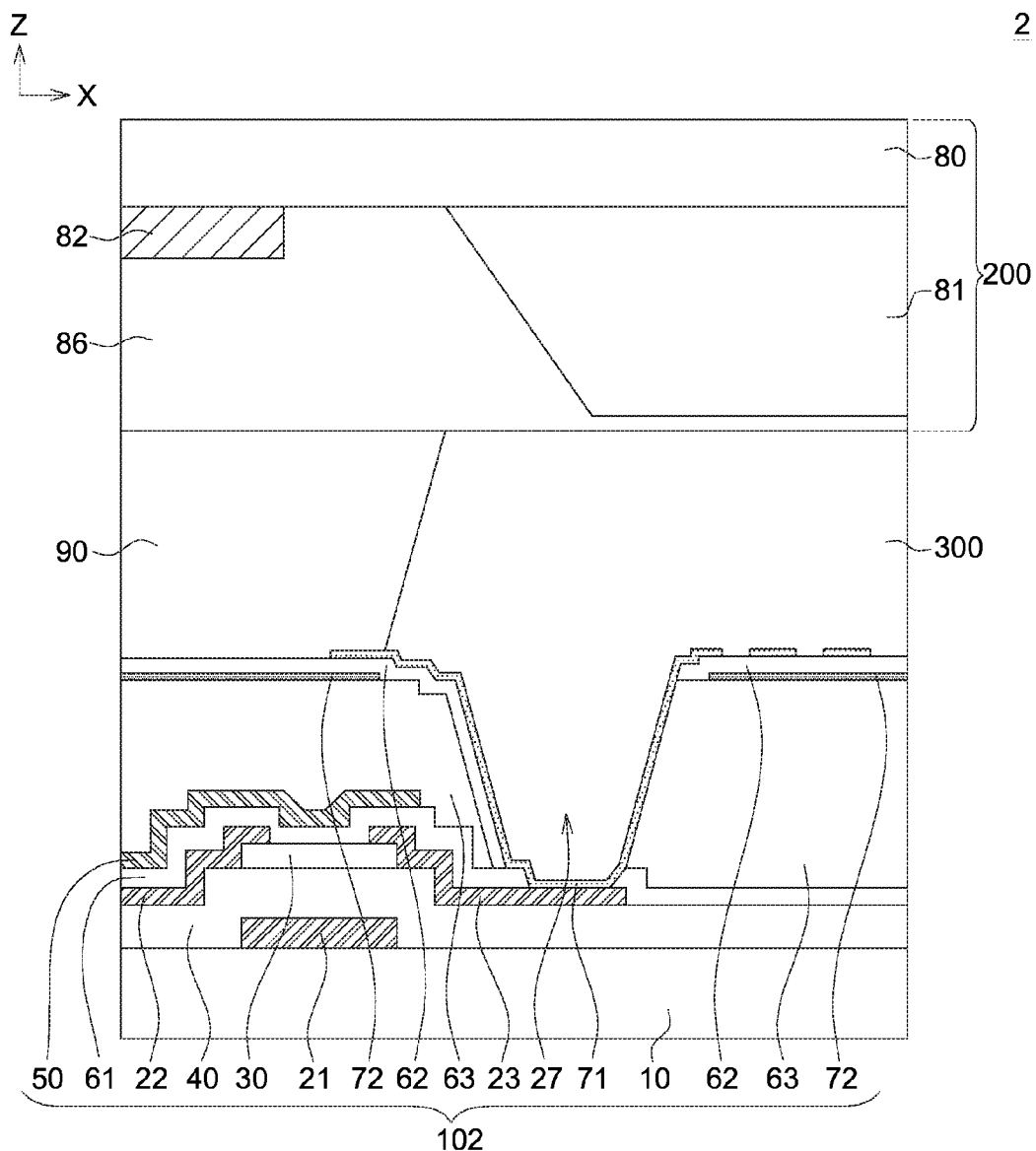
FIG. 3A is a partial cross-sectional view of a display panel according to the second embodiment of the present invention.
Figure 3B:
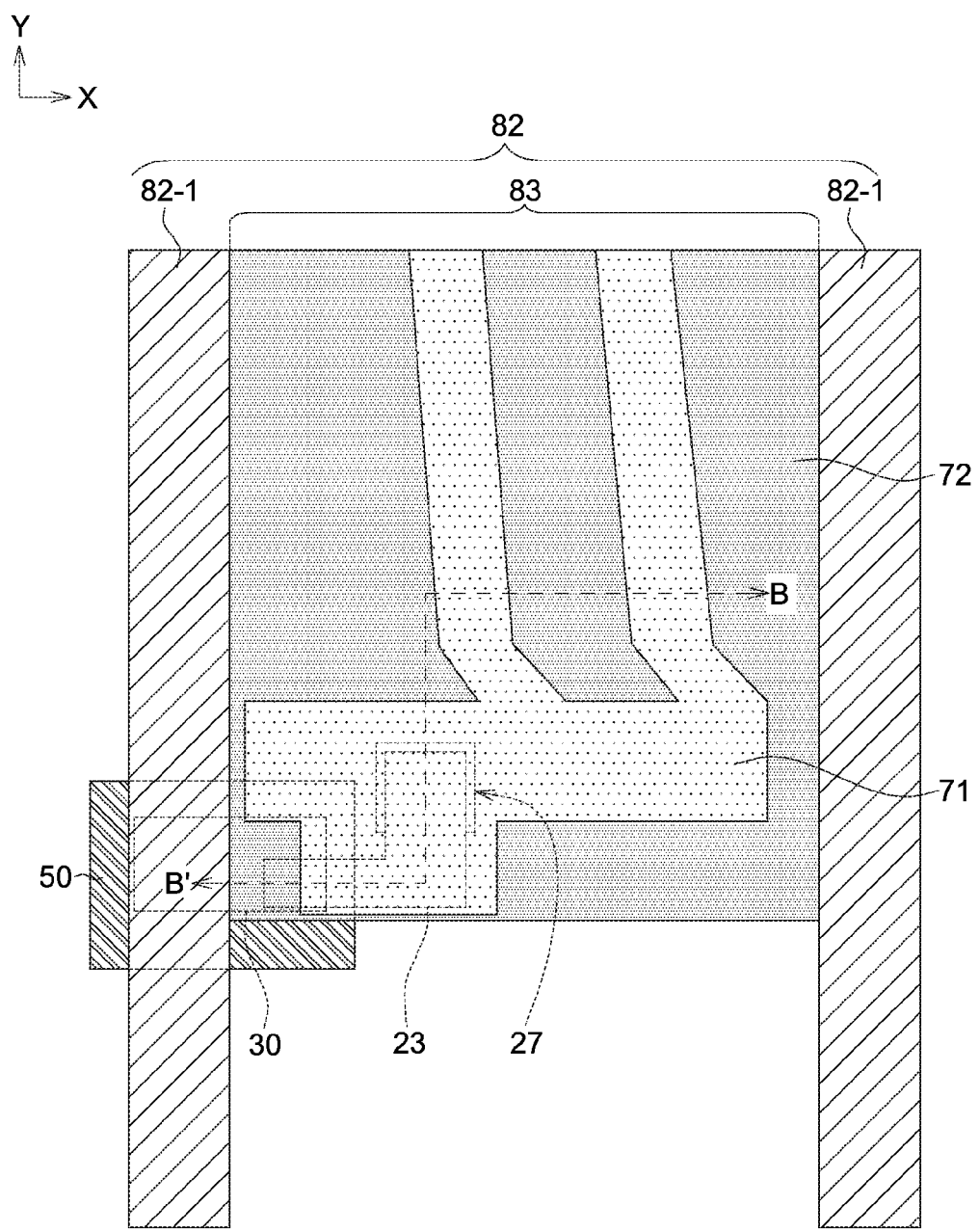
FIG. 3B is a partial top view of the display panel according to the second embodiment of the present invention.

FIG. 3A is a partial cross-sectional view of a display panel 2 according to the second embodiment of the present invention. FIG. 3B is a partial top view of a display panel 2 according to the second embodiment of the present invention. Here, FIG. 3A is a cross-sectional view of the display panel 1 viewed along a cross-sectional line B-B' of FIG. 3B. It should be noted that in order to more clearly illustrate the structure of the display panel 2, some elements such as the data line 22D and the gate line 21G are omitted in FIG. 3B.

Like the first embodiment, the display panel 2 may include a first substrate 102, a second substrate 200 and a display medium 300. The second substrate 200 and the first substrate 102 are disposed oppositely. The display medium 300 is disposed between the first substrate 102 and the second substrate 200. Moreover, the display panel 2 may also include a spacer 90 disposed between the first substrate 102 and the second substrate 200. The display panel 2 of the second embodiment is different from the display panel 1 of the first embodiment in the structure of the first substrate 102.

In the second embodiment of the present invention, the first substrate 102 includes a base substrate 10, a gate 21, an active layer 30, a source 22 and a drain 23, a gate insulating layer 40 and a shielding structure 50. The gate 21 is disposed on the base substrate 10. The active layer 30 is electrically insulated from and corresponds to the gate 21. The source 22 and the drain 23 are electrically connected to the active layer 30. The gate insulating layer 40 is disposed between the gate 21 and the active layer 30.

The first substrate 102 further may include a first protection layer 61, a first electrode 71 and a second electrode 72. The first protection layer 61 is disposed between the active layer 30 and the shielding structure 50. The first conductive layer 71 is in contact with the drain 23. Furthermore, the shielding structure 50 may have the same structure as that illustrated in FIG. 2C. That is, the anti-reflection structure 501 (the second anti-reflection layer 52) of the shielding structure 50 may be directly in contact with the first protection layer 61. The metal layer 500 and the anti-reflection structure 501 can effectively shield the active layer 30.

As indicated in FIG. 3A, the first substrate 102 further includes a second protection layer 62 and a planarization layer 63. The planarization layer 63 is disposed on the first protection layer 61. In the present embodiment, the planarization layer 63 can be disposed between the first protection layer 61 and the second electrode 72, and the planarization layer 63 can be formed of an organic material, such that the second electrode 72 can be electrically insulated from other elements (such as the active layer 30) of the first substrate 102. The second protection layer 62 is disposed on the planarization layer 63, and part of the second protection layer 62 is interposed between the first electrode 71 and the second electrode 72.

As indicated in FIG. 3A, the first substrate 102 may include a via 27 which penetrates the planarization layer 63 and the first protection layer 61 to expose a surface of the drain 23. At least part of the first electrode 71 is inside the via 27, such that the first electrode 71 can be electrically connected to the surface of the drain 23. That is, the first electrode 71 is disposed on the second protection layer 62, the drain 23 and the surface of the planarization layer 63 along the via 27, and directly in contact with the drain 23.

The first electrode 71 and the second electrode 72 can be realized by transparent conductive layers formed of such as ITO or IZO. In the present embodiment, the first electrode 71 can be realized by a pixel electrode layer, and the second electrode 72 can be realized by a common electrode layer. As indicated in FIG. 3B, the first electrode 71 can be grid-like.

Similarly, in one embodiment of the present invention, the second substrate 200 can be realized by a color filter substrate including a base substrate 80, a color filter 81, a light-shielding matrix 82 and a planarization layer 86. The planarization layer 86 can be realized by an organic transparent planarization layer. As indicated in FIG. 3B, the light-shielding matrix 82 includes a plurality of first light-shielding portions 82-1 and a plurality of first opening portions 83. The first light-shielding portions 82-1 are disposed at intervals and extend along a first direction (the Y direction), and the first opening portions 83 are exposed from the first light-shielding portions 82-1.

Since the shielding structure 50 (including a metal layer 500 and an anti-reflection structure 501) already shields the active layer 30, the light-shielding matrix 82 can be used to avoid light from mixing between adjacent pixels. Therefore, at least part of the vertical projection of the active layer 30 on the second substrate 200 falls inside the first opening portion 83. It can be seen from relative relationship between the active layer 30 and the light-shielding matrix 82 as illustrated in a planar diagram that the first opening portion 83 of the light-shielding matrix 82 exposes at least part of the active layer 30. That is, the light-shielding matrix 82 of the present embodiment does not need to shield the active layer 30 in the X direction. In some embodiments, the light-shielding matrix 82 can shield part, not all, of the active layer in the second direction. Thus, the area of the light-shielding matrix 82 can be reduced, and the aperture ratio of the display panel 2 can be increased.

Third Embodiment

Figure 4:
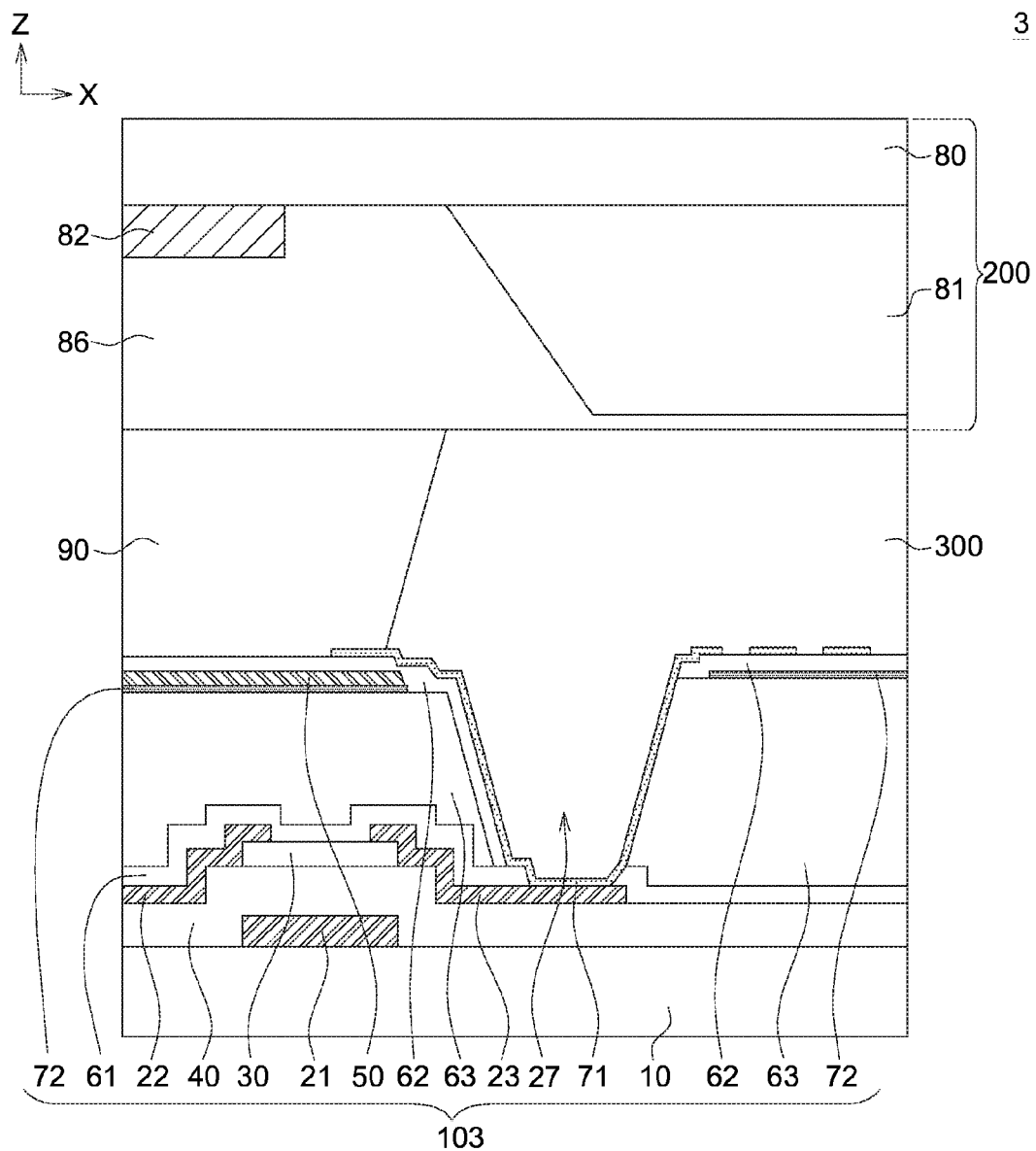
FIG. 4 is a partial cross-sectional view of a display panel according to the third embodiment of the present invention.

FIG. 4 is a partial cross-sectional view of a display panel 3 according to the third embodiment of the present invention. In the present invention, the top view of the display panel 3 of the third embodiment is similar to that of the second embodiment, and the structure may be disclosed with reference to FIG. 3B.

Like the second embodiment, the display panel 3 may include a first substrate 103, a second substrate 200 and a display medium 300. The second substrate 200 and the first substrate 103 are disposed oppositely. The display medium 300 is disposed between the first substrate 103 and the second substrate 200. Besides, the display panel 3 may also include a spacer 90 disposed between the first substrate 103 and the second substrate 200. The display panel 3 of the present embodiment is different from the display panel 2 of the second embodiment in the shielding structure 50 of the first substrate 103.

In the present embodiment, the shielding structure 50 may have the same structure as that illustrated in FIG. 2B. That is, the anti-reflection structure 501 of the shielding structure 50 is disposed above the metal layer 500, and completely covers the metal layer 500. Moreover, the metal layer 500 of the shielding structure 50 can be directly in contact with the second electrode 72.

Since the second electrode 72 can be realized by transparent conductive layers formed of such as ITO or IZO, the second electrode 72 can be used as another anti-reflection layer for the shielding structure 50. That is, in the present embodiment, the anti-reflection structure may include an electrode (that is, the second electrode 72), and through the design of making the metal layer 500 directly in contact with the second conductive layer 72, the reflectance of the metal layer 500 can be effectively reduced. Here, the anti-reflection structure 501 disposed above the metal layer 500 can reduce the reflection of the ambient light coming from the outside of the display panel 3, the second electrode 72 reduces the reflection of the light emitted from a backlight module (not illustrated).

In an embodiment of the present invention, the shielding structure 50 may include a metal layer 500, a first anti-reflection layer 51 disposed above the metal layer 500, and a second anti-reflection layer 52 disposed under the metal layer 500 (see FIG. 2C). The first anti-reflection layer 51 may include an alloy nitride and a transparent conductive layer. The second anti-reflection layer 52 may include a transparent conductive layer. For example, the shielding structure 50 can be realized by a laminated layer of ITO/AlCu/AlCuN/ITO, wherein ITO is a transparent conductive layer, which can be shared with a pixel electrode or a common electrode. For example, the transparent conductive layer can be shared with the second electrode 72.

Similarly, as indicated in FIG. 4, the first substrate 103 may include a via 27, which penetrates the planarization layer 63 and the first protection layer 61 to expose a surface of the drain 23. At least part of the first electrode 71 is disposed inside the via 27, such that the first electrode 71 can be electrically connected to the surface of the drain 23. That is, the first electrode 71 is disposed on the second protection layer 62, the drain 23 and the surface of the planarization layer 63 along the via 27, and directly in contact with the drain 23.

In the third embodiment of the present invention, the structure of the second substrate 200 is similar to that of the first and the second embodiments, and is not repeated here.

Fourth Embodiment

Figure 5A:
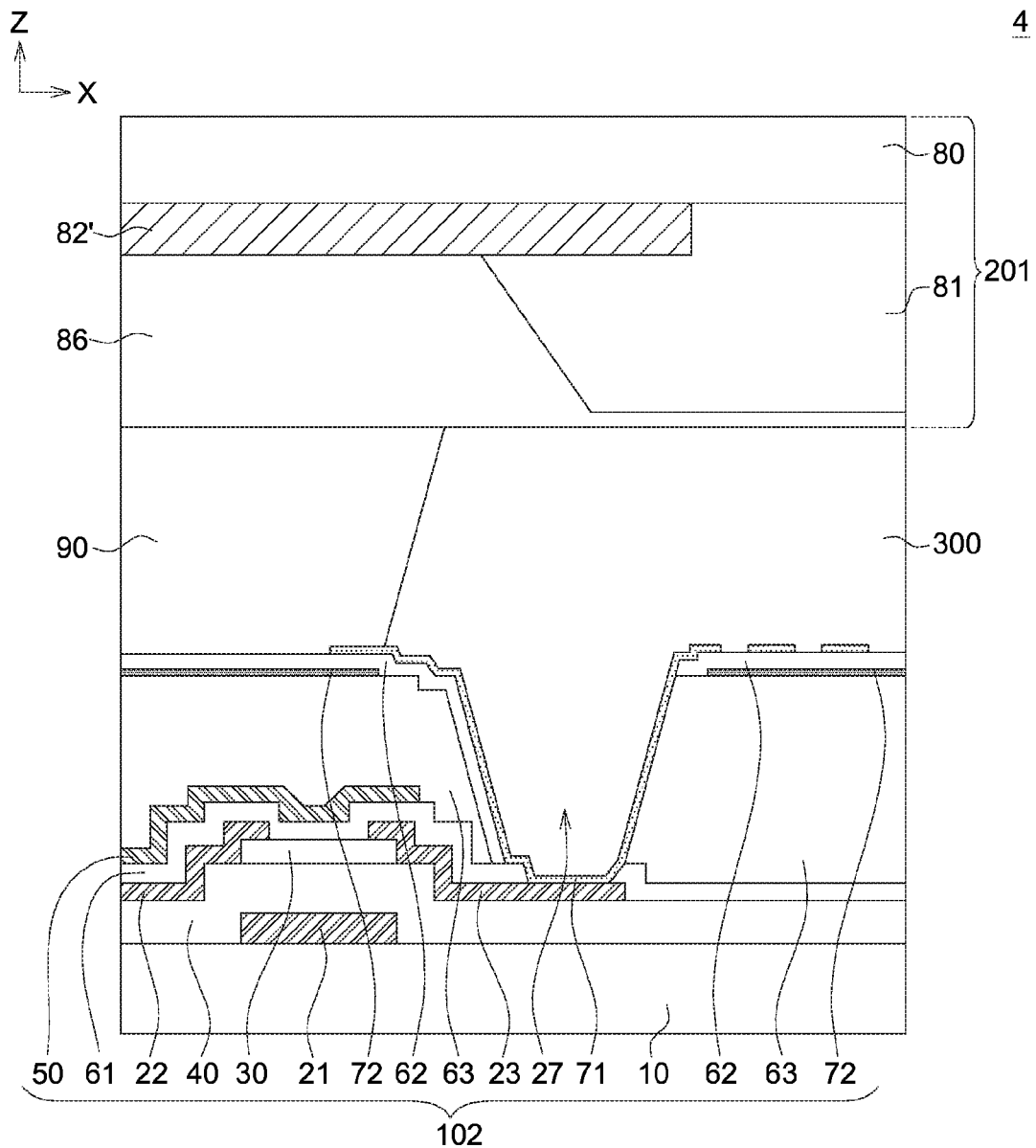
FIG. 5A is partial cross-sectional view of a display panel a according to the fourth embodiment of the present invention.
Figure 5B:
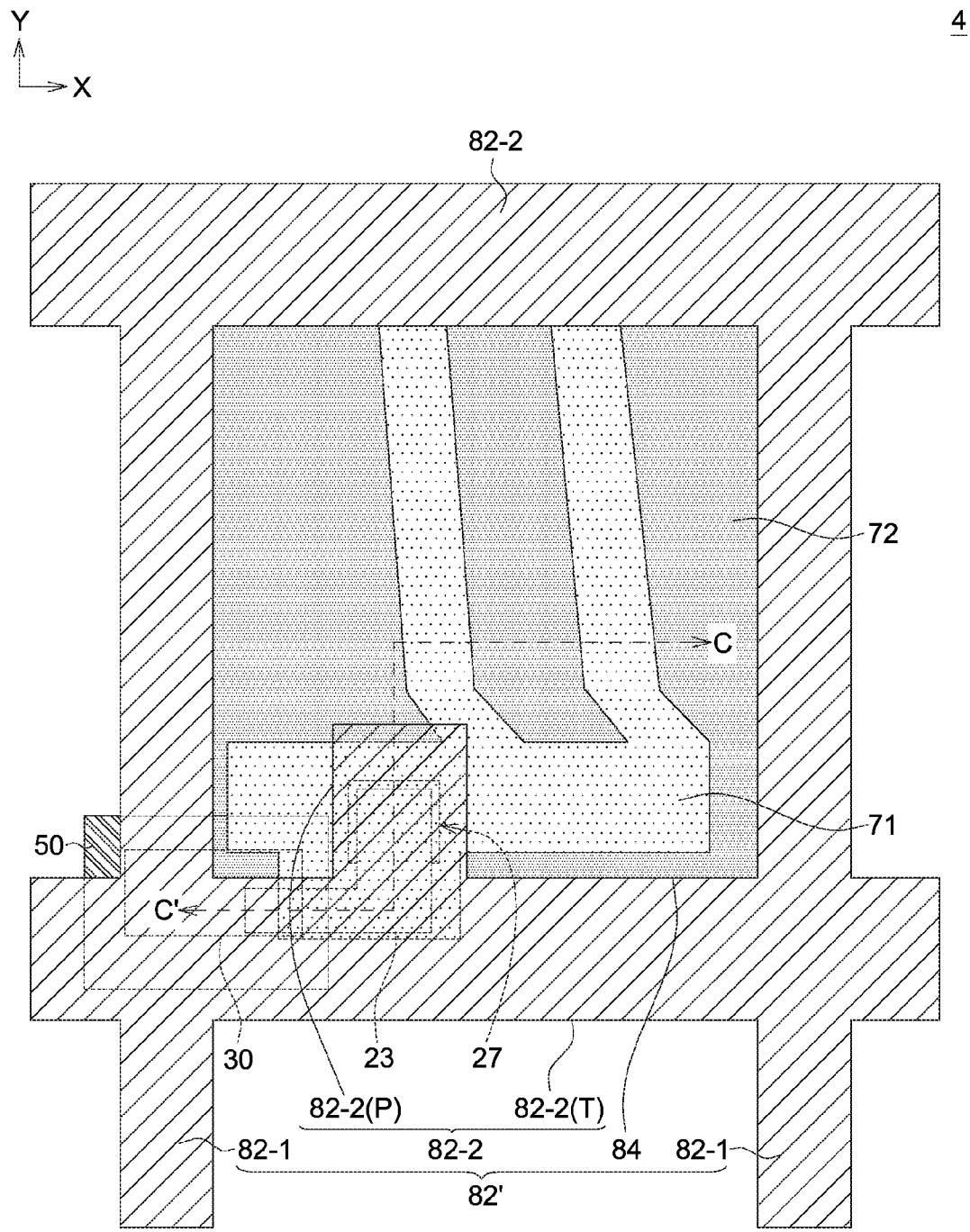
FIG. 5B is a partial top view of the display panel according to the fourth embodiment of the present invention.

FIG. 5A is partial cross-sectional view of a display panel 4 according to the fourth embodiment of the present invention. FIG. 5B is a partial top view of the display panel 4 according to the fourth embodiment of the present invention. Here, FIG. 5A is a cross-sectional view of the display panel 4 viewed along a cross-sectional line C-C' of FIG. 5B. Some elements such as the data line 22D and the gate line 21G are omitted in FIG. 5B, such that the structure of the display panel 4 can be more clearly illustrated.

Like the second embodiment, the display panel 4 may include a first substrate 102, a second substrate 201 and a display medium 300. The second substrate 201 and the first substrate 102 are disposed oppositely. The display medium 300 is disposed between the first substrate 102 and the second substrate 201. Additionally, the display panel 4 may also include a spacer 90 disposed between the first substrate 102 and the second substrate 201. The display panel 4 of the fourth embodiment is different from the display panel 2 of the second embodiment in the structure of the second substrate 201.

Due to the existence of the via 27, part of liquid crystal molecules may be located inside the via 27, making the operation of liquid crystal molecules abnormal. In the present embodiment, the light-shielding matrix 82' is used to shield the via 27 to avoid the operation of liquid crystal molecules from being abnormal and affecting the display quality.

In the present embodiment, the second substrate 201, such as a color filter substrate, may include a base substrate 80, a color filter 81, a light-shielding matrix 82' and a planarization layer 86. The planarization layer 86 can be realized by an organic transparent planarization layer. The light-shielding matrix 82' includes a plurality of first light-shielding portions 82-1, a plurality of second light-shielding portions 82-2 and a plurality of second opening portions 84. The first light-shielding portions 82-1 are disposed at intervals and extend along a first direction. The second light-shielding portions 82-2 extend along a second direction. The first direction and the second direction are not the same. In the present embodiment, the first direction refers the Y direction, and the second direction refers the X direction. The second opening portions 84 are exposed from the first light-shielding portions 82-1 and the second light-shielding portions 82-2.

For example, FIG. 5B illustrates two first light-shielding portions 82-1 and two second light-shielding portions 82-2. The region interposed between the two first light-shielding portions 82-1 and the two second light-shielding portions 82-2 is the second opening portion 84. Furthermore, at least one of the second light-shielding portions 82-2 may have a bar portion 82-2(T) and a protrusion 82-2(P) protruded from a side of the bar portion 82-2(T).

In the present embodiment, the light-shielding matrix 82' is disposed on the via 27, the protrusion 82-2(P) can shield the via 27, and at least part of the vertical projection of the active layer 30 of the first substrate 102 on the second substrate 201 falls inside the second opening portion 84. It can be seen from relative relationship between the active layer 30 and the light-shielding matrix 82' as illustrated in the diagram that the second opening portion 84 of the light-shielding matrix 82' exposes at least part of the active layer 30.

Besides, the first light-shielding portions 82-1 of the light-shielding matrix 82' can be used to avoid light from mixing between adjacent pixels, and the second light-shielding portions 82-2 can be used to shield the via 27. Since the shielding structure 50 (includes the metal layer 500 and the anti-reflection structure 501) already shields the active layer 30, the light-shielding matrix 82' of the present embodiment can be used to avoid light from mixing between adjacent pixels and correspondingly shield the via 27. In some embodiments, the light-shielding matrix 82 can shield part, not all, of the active layer 30 in the second direction. Thus, the area of the light-shielding matrix 82' can be effectively reduced, and the aperture ratio of the display panel 4 can be increased.

Fifth Embodiment

Figure 6:
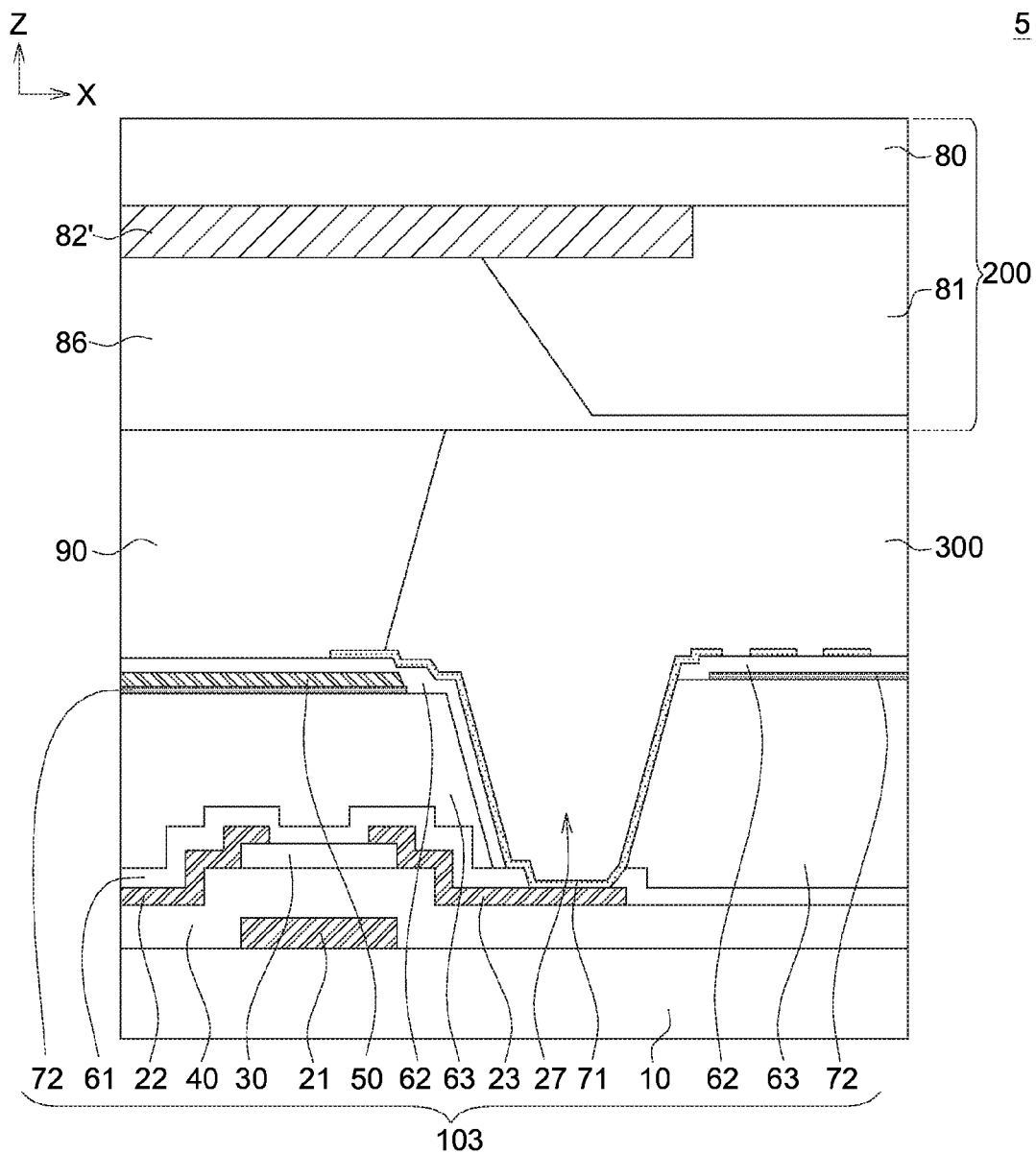
FIG. 6 is a partial cross-sectional view of a display panel according to the fifth embodiment of the present invention.

FIG. 6 is a partial cross-sectional view of a display panel 5 according to the fifth embodiment of the present invention. In the present invention, the top view of the display panel 5 of the fifth embodiment is similar to that of the fourth embodiment, and the structure is disclosed with reference to FIG. 5B.

In the present embodiment, the shielding layer 50 may have the same structure as that illustrated in FIG. 2B. That is, the anti-reflection structure 501 of the shielding structure 50 is disposed above the metal layer 500 and completely covers the metal layer. Moreover, as indicated in FIG. 6, the shielding layer 50 (the metal layer 500 of the shielding layer 50) may be directly in contact with the second electrode 72.

Since the second electrode 72 can be realized by transparent conductive layers formed of such as ITO or IZO, the second electrode 72 can be used as another anti-reflection structure for the metal layer 500. That is, through the design of making the metal layer 500 directly in contact with the second conductive layer 72, the reflectance of the metal layer 500 can be effectively reduced.

In the fifth embodiment of the present invention, the display panel may also include a second substrate 201, such as a color filter substrate. The second substrate 201 may include a base substrate 80, a color filter 81, a light-shielding matrix 82' and a planarization layer 86. The planarization layer 86 can be realized by an organic transparent planarization layer. The light-shielding matrix 82' is disposed on the via 27, and may include a plurality of first light-shielding portions 82-1 and a plurality of second light-shielding portions 82-2. The first light-shielding portions 82-1 can be used to avoid light from mixing between adjacent pixels. The protrusion 82-2(P) of the second light-shielding portions 82-2 can be used to shield the via 27. Since the shielding structure 50 (including a metal layer 500 and an anti-reflection structure 501) is in contact with the second electrode 72 and shields the active layer 30, the light-shielding matrix 82' can be used to avoid light from mixing between adjacent pixels and correspondingly shield the via 27. The light-shielding matrix 82' can shield part, not all, of the active layer 30 in the second direction. Thus, the area of the light-shielding matrix 82' can be reduced, and the aperture ratio of the display panel 5 can be increased.

The shielding structure 50 of the present invention can be used to shield the active layer 30 of the transistor. Therefore, the light-shielding matrix 82 or 82' on the opposite side of the substrate does not need to shield the entire active layer 30 or only needs to shield part of the active layer 30. Thus, the area of the light-shielding matrix 82 or 82' can be reduced and the aperture ratio of the display panel can be increased. Although the display panel is exemplified by a fringe field switching liquid crystal display (FFS LCD) in the above embodiments, the present invention is not limited thereto. The present invention may be applicable to all types of display panel with transistor such as LCD panel and OLED panel. The present invention can also be used in other types of LCD panel in addition to the FFS LCD. Exemplarily but not restrictively, the present invention can be used in twisted nematic (TN) LCD, in-plane switching (IPS) LCD, and vertical alignment (VA) LCD.

In some embodiments of the present invention, the metal layer 500 of the display panel can be used in conjunction with the anti-reflection structure 501 to shield the active layer 30. This is because metal whose reflectance is too high may be unable to effectively shield the active layer 30, and the anti-reflection structure 501 is used to reduce the reflection of the light. Therefore, the metal layer 500 in conjunction with the anti-reflection structure 501 can achieve excellent shielding effect. In an embodiment below, reflectance for different wavelengths of the light reflected by the anti-reflection structure 501 formed of aluminum-copper nitride (Al—Cu—N)/indium zinc oxide (IZO) is measured.

Figure 7A:
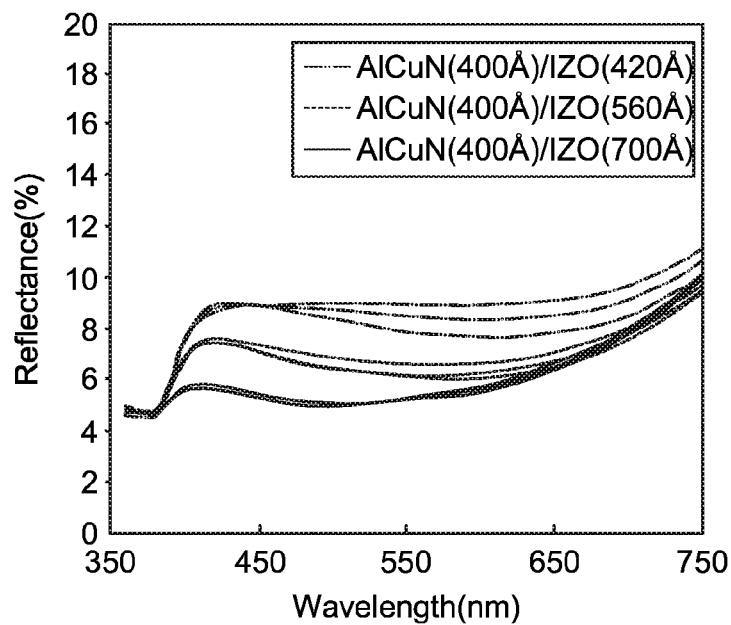
FIGS. 7A~7C are measurement results of reflectance for different wavelengths of the light reflected by the shielding structure AlNd/AlCuN/IZO.
Figure 7B:
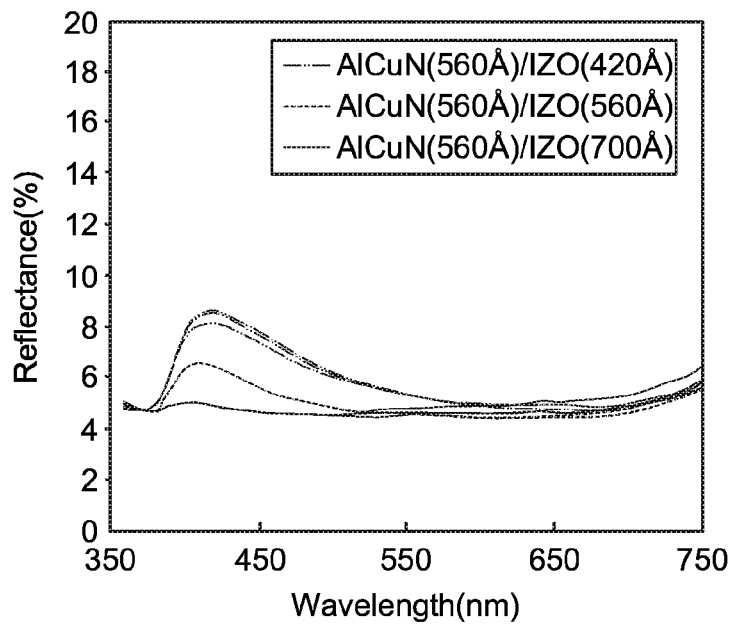
Figure 7C:
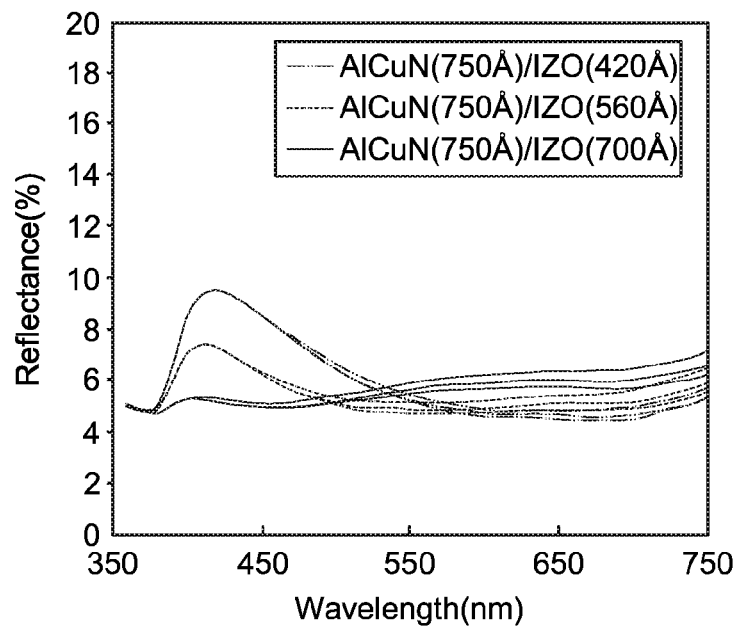

FIGS. 7A~7C are measurement results of reflectance for different wavelengths of the light reflected by the shielding structure AlNd/AlCuN/IZO. FIG. 7A shows a measurement result of reflectance for different wavelengths of the light reflected by the shielding structure AlNd/AlCuN/IZO in conjunction with a polarizer (AlCuN with a fixed thickness of 400 Å and IZO with various thicknesses of 420 Å, 560 Å and 700 Å). FIG. 7B shows a measurement result of reflectance for different wavelengths of the light reflected by the shielding structure AlNd/AlCuN/IZO in conjunction with a polarizer (AlCuN with a fixed thickness of 560 Å, and IZO with various thicknesses of 420 Å, 560 Å and 700 Å). FIG. 7C shows a measurement result of reflectance for different wavelengths of the light reflected by the shielding structure AlNd/AlCuN/IZO in conjunction with a polarizer (AlCuN with a fixed thickness of 750 Å, and IZO with various thicknesses of 420 Å, 560 Å and 700 Å).

Figure 8:
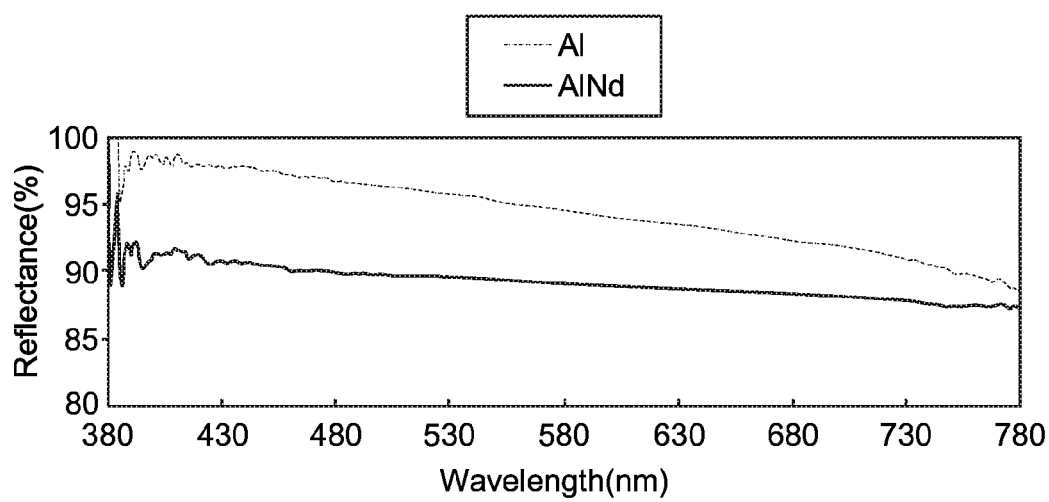
FIG. 8 is a measurement result of reflectance for different wavelengths of the light reflected by Al and Al—Nd alloy (2500 Å).

FIG. 8 is a measurement result of reflectance for different wavelengths of the light reflected by Al and Al—Nd alloy (2500 Å).

A comparison between FIGS. 7A~7C and FIG. 8 shows that under whatever combination of thickness, the reflectance for different wavelengths of the light reflected by AlNd/AlCuN/IZO is significant lower than the reflectance for different wavelengths of the light reflected by Al or Al—Nd alloy. That is, the anti-reflection structure 501 formed of AlCuN/IZO can effectively reduce the reflection of the light, such that the metal layer 500 used in conjunction with the anti-reflection structure 501 can achieve excellent shielding effect.

According to the display panel disclosed in above embodiments of the present invention, through the design of disposing a metal layer and an anti-reflection structure on the substrate, the area of the light-shielding matrix can be reduced, the aperture ratio of the display panel can be effectively increased, and power consumption of the display can be further reduced.

While the invention has been described by way of example and in terms of the embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
   a first substrate, comprising:
      a base substrate;
      a gate disposed on the base substrate;
      an active layer electrically insulated from and disposed correspondingly to the gate;
      a source and a drain electrically connected to the active layer; and
      a shielding structure disposed on the active layer, wherein the shielding structure covers at least part of the active layer and comprises a metal layer and an anti-reflection structure, and wherein the shielding structure is electrically insulated from the source;
   a second substrate; and
   a display medium disposed between the first substrate and the second substrate.

2. The display panel according to claim 1, wherein the first substrate further comprises:
   a first protection layer disposed between the active layer and the shielding structure, wherein the shielding structure is electrically insulated from the active layer by the first protection layer.

3. The display panel according to claim 1, wherein the second substrate comprises a light-shielding matrix, and the light-shielding matrix comprises:
   a plurality of first light-shielding portions; and
   a plurality of first opening portions exposed by the first light-shielding portions,
   wherein the first light-shielding portions are disposed at intervals and extend along a first direction, and at least part of a vertical projection of the active layer on the second substrate falls inside the first opening portion.

4. The display panel according to claim 2, wherein the first substrate further comprises:
   a planarization layer disposed on the first protection layer.

5. The display panel according to claim 4, wherein the first substrate further comprises:
   a via penetrating the planarization layer and the first protection layer to expose a surface of the drain; and
   a first electrode, wherein at least part of the first electrode is disposed in the via, such that the first electrode is electrically connected to the surface of the drain.

6. The display panel according to claim 5, wherein the second substrate comprises a light-shielding matrix, and the light-shielding matrix comprises:
   a plurality of first light-shielding portions;
   a plurality of second light-shielding portions; and
   a plurality of second opening portions exposed by the first light-shielding portions and the second light-shielding portions,
   wherein the first light-shielding portions are disposed at intervals and extend along a first direction, the second light-shielding portions extend along a second direction different from the first direction, at least one of the second light-shielding portions has a bar portion and a protrusion protruded from a side of the bar portion, the protrusion shields the via, and at least part of a vertical projection of the active layer on the second substrate falls inside the second opening portion.

7. The display panel according to claim 4, wherein the anti-reflection structure comprises an electrode.

8. The display panel according to claim 7, wherein the anti-reflection structure is formed of a material selected from the group consisting of indium tin oxide and indium zinc oxide.

9. The display panel according to claim 1, wherein the metal layer is formed of a material selected from the group consisting of aluminum, molybdenum, chromium, nickel, copper, iron, neodymium, an alloy thereof, and a mixture thereof.

10. The display panel according to claim 1, wherein the anti-reflection structure is formed of a material selected from the group consisting of a metal oxide, a metal nitride, a metal alloy oxide, a metal alloy nitride, and a mixture thereof.

11. The display panel according to claim 1, wherein the anti-reflection structure is in contact with the metal layer.

12. The display panel according to claim 1, wherein the anti-reflection structure contains a metal element the same as a metal element contained in the metal layer.

* * * * *